US011448200B2

(12) United States Patent
Hau et al.

(10) Patent No.: US 11,448,200 B2
(45) Date of Patent: Sep. 20, 2022

(54) ACTUATOR WITH RESTORING SPRINGS

(71) Applicant: Universität des Saarlandes, Saarbrücken (DE)

(72) Inventors: Steffen Hau, Homburg (DE); Philipp Linnebach, Illingen (DE); Stefan Seelecke, Saarbrücken (DE)

(73) Assignee: Universität des Saarlandes, Saarbrücken (DE)

( * ) Notice: Subject to any disclaimer, the term of this patent is extended or adjusted under 35 U.S.C. 154(b) by 0 days.

(21) Appl. No.: 17/425,739

(22) PCT Filed: Jan. 23, 2020

(86) PCT No.: PCT/EP2020/051557
§ 371 (c)(1),
(2) Date: Jul. 26, 2021

(87) PCT Pub. No.: WO2020/152237
PCT Pub. Date: Jul. 30, 2020

(65) Prior Publication Data
US 2022/0163019 A1 May 26, 2022

(30) Foreign Application Priority Data
Jan. 24, 2019 (DE) .................. 102019101717.3

(51) Int. Cl.
*F03G 7/06* (2006.01)
*F16D 121/18* (2012.01)
*F16K 31/02* (2006.01)

(52) U.S. Cl.
CPC ........ *F03G 7/0635* (2021.08); *F16D 2121/18* (2013.01); *F16K 31/02* (2013.01)

(58) Field of Classification Search
CPC ..... F03G 7/0635; F16D 2121/18; F16K 31/02
(Continued)

(56) References Cited

U.S. PATENT DOCUMENTS 4,525,343 A * 6/1985 Raaf ...................... A61Q 11/00
424/48
4,725,002 A 2/1988 Trachte
(Continued)

FOREIGN PATENT DOCUMENTS

DE 2931874 C2 2/1981
DE 3237258 C1 12/1983
(Continued)

OTHER PUBLICATIONS

Hau S et al. "Silicone based dielectric elastomer strip actuators coupled with nonlinear biasing elements for large actuation strains", Smart Materials and Structures, vol. 27, Jun. 5, 2018 (Jun. 5, 2018), DOI: 10.1088/1361-665X/AAB7D8, ISSN: 0964-1726, 074003, XP020328329, Sections 2.3, 5; Figures 8, 14.
(Continued)

*Primary Examiner* — Hoang M Nguyen
(74) *Attorney, Agent, or Firm* — Michael Soderman

(57) ABSTRACT

The invention relates to an actuator (1; 1a; 1b) which can be moved from an initial position into a working position having at least one actuator element (2; 2a; 2b) whose dimensions can changed by an electrical signal, Appropriately, at least two restoring means (20, 30; 20a, 30a; 20b, 30b) acting on the actuator element (2; 2a; 2b) are provided for movement into the working position. With the at least two restoring means, a total restoring means characteristic curve, which is composed of portions of the individual, preferably preloaded restoring means as well as a portion of a variable stiffness of the actuator element, can be advantageously tailored.

13 Claims, 7 Drawing Sheets

(58) Field of Classification Search
USPC .............................. 60/527–529; 310/305–309
See application file for complete search history.

(56) References Cited

U.S. PATENT DOCUMENTS

| | | | | |
|---|---|---|---|---|
| 6,253,837 B1* | 7/2001 | Seiler | ...................... | F28F 27/02 |
| | | | | 137/625.29 |
| 2009/0173305 A1* | 7/2009 | Alexander | ............ | F02B 27/005 |
| | | | | 60/527 |
| 2011/0179790 A1* | 7/2011 | Pretorius | ................ | F03G 7/065 |
| | | | | 60/527 |
| 2015/0027571 A1* | 1/2015 | Kishi | ...................... | F16K 15/18 |
| | | | | 137/614.2 |

FOREIGN PATENT DOCUMENTS

| | | |
|---|---|---|
| DE | 19940055 C1 | 4/2001 |
| DE | 102008042862 A1 | 4/2010 |
| DE | 102009012626 A1 | 9/2010 |
| DE | 102012211696 A1 | 1/2013 |
| DE | 102016114566 A1 | 2/2017 |
| DE | 102017120131 A1 | 3/2019 |
| EP | 2097937 B1 | 4/2016 |
| WO | 2001025613 A1 | 4/2001 |

OTHER PUBLICATIONS

Hau S et al. "A novel design concept to boost the force output of dielectric elastomer membrane actuators", Electroactive Polymer Actuators and Devices (EAPAD) XXI, Mar. 4-7, 2019, Denver, CO, USA; Proceedings of SPIE, vol. 10966, 109660N, 2019, XP060121698, ISSN: 0277-786X, DOI: 10.1117/12.2514210, ISBN: 978-1-5106-3377-3, Sections 2.1, 3; Figs. 2c, 2d, 5.

* cited by examiner

ACTUATOR WITH RESTORING SPRINGS

CROSS REFERENCE TO RELATED APPLICATIONS

This application is the U.S. national stage of International Application No. PCT/EP2020/051557, filed on 2020 Jan. 23. The international application claims the priority of DE 102019101717.3 filed on 2019 Jan. 24; all applications are incorporated by reference herein in their entirety.

BACKGROUND

The invention relates to an actuator which can be moved from an initial position to a working position and has at least one actuator element whose dimensions can be changed by an electrical signal.

An actuator is known from the prior art which has an actuator element formed as a foil-shaped dielectric elastomer (DE actuator) which is connected in series with a single restoring means, for example a snap spring. When an electrical signal, which may be a high voltage, is applied, an extension of the actuator element causes a movement from the initial position to an end position at which the snap spring can snap from a first to a second equilibrium position and actuate an actuating element. When the electrical signal is removed, a return movement into the initial position occurs, during which the actuator element returns to its original, shortened position and entrains the snap spring to its first equilibrium position. Working positions between the initial position and the end position can be controlled by suitable signal selection.

Furthermore, an actuator element is known from the prior art which is formed from a shape memory alloy (SMA; SMA actuator). Shape memory alloys are mechanically deformable and can return to an undeformed initial state by heating, for example by application of an electric current. An SMA actuator element is usually connected in series with a single restoring means, which may in particular be a helical spring.

In both the known DE actuator and the known SMA actuator, one end of the actuator element is firmly connected to an actuator housing or to an actuator frame. As a result, the actuator housing or the actuator frame acts as a fixed abutment during a movement from the basic position to one of the possible working positions and back.

While a DE actuator allows large strokes with moderate force generation, an SMA actuator allows small strokes with large force generation.

SUMMARY

The invention relates to an actuator (1; 1a; 1b) which can be moved from an initial position into a working position having at least one actuator element (2; 2a; 2b) whose dimensions can changed by an electrical signal. Appropriately, at least two restoring means (20, 30; 20a, 30a; 20b, 30b) acting on the actuator element (2; 2a; 2b) are provided for movement into the working position. With the at least two restoring means, a total restoring means characteristic curve, which is composed of portions of the individual, preferably preloaded restoring means as well as a portion of a variable stiffness of the actuator element, can be advantageously tailored.

DETAILED DESCRIPTION

An object of the present invention is to create an actuator that overcomes the disadvantages of known actuators. In particular, a large force can be generated with a DE actuator and a large stroke with an SMA actuator. Furthermore, force/stroke combinations tailored to individual special applications are conceivable.

According to the invention, the object is achieved in that at least two restoring means acting on the actuator element are provided for movement into the working position. Due to the at least two restoring means, a total restoring means characteristic curve, which is composed of portions of the individual, preferably preloaded restoring means as well as a portion of a variable stiffness of the actuator element, can be advantageously tailored. In particular, energy can be stored by the restoring means, which is available for movement out of the basic position into the working position or an end position and which can be used to generate a large stroke and/or a large force. Furthermore, a uniform stroke or force generation can be ensured over the entire movement from the initial position to the working position or to the end position. This is particularly advantageous for applications in robotics.

Expediently, the at least one actuator element is floatingly mounted between the at least two restoring means acting on the actuator element. A fixed abutment directly connected to the actuator element is not provided. Advantageously, no bearing forces occur. The energy stored by the, in particular, preloaded restoring means is available for movement of the actuator from an initial position to a working position.

In one embodiment of the invention, a first and a second restoring means are the same or different from each other. The restoring means can be arranged on opposite sides of the actuator element and allow the actuator element to move freely ("floating"), in particular in or against an effective direction of the restoring means. If the restoring means are of the same design, manufacturing is simplified. If the restoring means are designed differently from one another, a required stroke or a required force to be generated can be tailored. Each of the restoring means can have a spring, for example a snap spring, a helical spring and/or a helical tension spring.

A snap spring is any spring with a nonlinear characteristic that is movable by a force from a first equilibrium position to a second equilibrium position different from the first. Further, each of the restoring means may have a linear or nonlinear restoring means characteristic.

In a further embodiment of the invention, a first restoring means comprises at least one nonlinear spring, in particular a snap spring, and/or a second restoring means comprises at least one linear spring, in particular a helical spring. A non-linear spring has a non-linear spring characteristic, a linear spring has a linear spring characteristic.

The use of a snap spring and a helical spring has proven to be particularly advantageous for effecting a large force with a large stroke at the same time, regardless of the design. By snapping the snap spring from a first to a second equilibrium position, a large stroke can be effected, which depends on a snap travel, while the linear spring favors the generation of a large force.

It is also conceivable that a first reset means comprises a body formed of a magnetic material, which is arranged at a variable distance from a plate formed of a metal or a further body formed of a magnetic material. The magnetic body and the plate or the further magnetic body have opposite or equal polarity on surfaces facing each other. In the case of equal polarity, a magnetic repulsive force increases with decreasing distance, and in the case of opposite polarity, a magnetic attractive force increases with decreasing distance.

This arrangement makes it possible to form a nonlinear attraction force characteristic. The technical effect is analogous to that achievable with a nonlinear spring, in particular a snap spring.

Expediently, one of the restoring means comprises at least one non-linear spring, preferably designed as a snap spring, end sections of which are arranged obliquely, horizontally or perpendicularly to an actuator frame side part of an actuator frame. Usually, the at least one actuator element is surrounded by an actuator housing or an actuator frame. If end sections of a non-linear spring are arranged within the actuator frame side part perpendicularly thereto, a different actuator-specific spring characteristic can be set than if the end sections are arranged within the actuator frame side part obliquely thereto. If the end sections are inserted into an actuator frame side part at an angle and connected to it, the non-linear spring, which is preferably designed as a snap spring, can only snap over in a working direction, i.e. from the initial position of the actuator to an end position. Snapping over in a direction opposite to the working direction and beyond the initial position is advantageously avoided.

In one embodiment of the invention, the at least one actuator element is planar, cylindrical or frustoconical. A planar actuator element is preferably formed from a dielectric polymer, in particular a dielectric elastomer. A cylindrically formed actuator element is formed from a wire comprising a shape memory alloy.

It is conceivable that the at least one actuator element is formed from a dielectric elastomer film rolled up into a cylinder. The cylinder is adapted to increase its length and decrease its radius when an electrical signal, for example a high voltage, is applied.

In another embodiment of the invention, a length of the at least one actuator element can be changed by an electrical signal, a change in length preferably taking place in an actuator element plane or along an axis of symmetry in a longitudinal direction. It is conceivable that the change in length takes place parallel to an, in particular, straight actuator frame side part of an actuator frame or actuator housing surrounding the at least one actuator element. A change in length occurs in or against an effective direction of forces of the restoring means at actuator element ends on which restoring means act when a voltage is applied. Advantageously, a particularly large force and/or a particularly large stroke can be effected.

If the at least one actuator element is formed from a dielectric elastomer film rolled up into a cylinder, a change in length occurs along the cylinder axis and/or in the radial direction.

Expediently, the at least one actuator element is deflectable in a direction that is parallel or coaxial to an effective direction of a restoring force of at least one of the restoring means acting on the actuator element. Restoring forces can directly cause a deflection. Loss, for example due to transverse forces that do not contribute to the deflection, is advantageously prevented.

In one embodiment of the invention, at least one of the two restoring means is arranged within the actuator frame or actuator housing. For example, the actuator housing may protect against contamination. A longer service life is possible.

In one embodiment of the invention, a first end portion of the at least one actuator element and a second end section, preferably opposite the first section, are provided with retaining elements, in particular clamping rails. Advantageously, ends of the actuator element on which forces of the restoring means act can be held particularly well. In addition, several actuator elements arranged parallel to one another, in particular planar ones, can be fixed in a stable position relative to one another.

An actuating means is expediently provided, which is also set up for guiding a movement out of the initial position into the working position. For this purpose, the guiding means can be of cylindrical design and can be guided out through an opening in the actuator frame or the actuator housing. Advantageously, a directed force can be applied. In particular, a longitudinal axis of the actuating means can be coaxial with a direction of action of the restoring means. In addition, the actuating means can act as a guiding means up to an end position of the actuator.

In one embodiment of the invention, several planar actuator elements arranged parallel to each other are provided. Advantageously, a force of several actuator elements can be used. In addition, a symmetrical arrangement of the actuator elements can prevent transverse forces from occurring when the actuator moves from the initial position to the working position. The only forces that occur are preferably those in a deflection direction of the actuator element and/or an effective direction of the forces of the restoring means.

Conveniently, at least one cylindrical actuator element is provided, which is formed from a rolled-up actuator foil. Advantageously, a particularly compact design of the actuator can be achieved. A change in length takes place along the cylinder axis and/or in the radial direction. An actuator foil can, for example, be a foil formed from a dielectric elastomer.

In another embodiment of the invention, at least one of the two restoring means is preloaded and forms a component of an assembly to be actuated, for example a valve or a brake, or an actuating means forms a component of an assembly to be actuated, for example a valve or a brake. Advantageously, a manufacture of an assembly to be actuated is simplified. Separate assembly is not necessary.

In one embodiment of the invention, the actuator element comprises a dielectric foil or is formed of a shape memory alloy. Known shape memory alloys include, for example, nickel and titanium.

An actuator element comprising a dielectric foil enables a particularly large stroke, while an actuator element formed from a shape memory alloy is particularly suitable for generating a large force.

Embodiments of the invention are to be explained in more detail below on the basis of examples with reference to the non-limiting figures.

DETAILED DESCRIPTION OF THE PREFERRED EMBODIMENTS

Figure 1A:
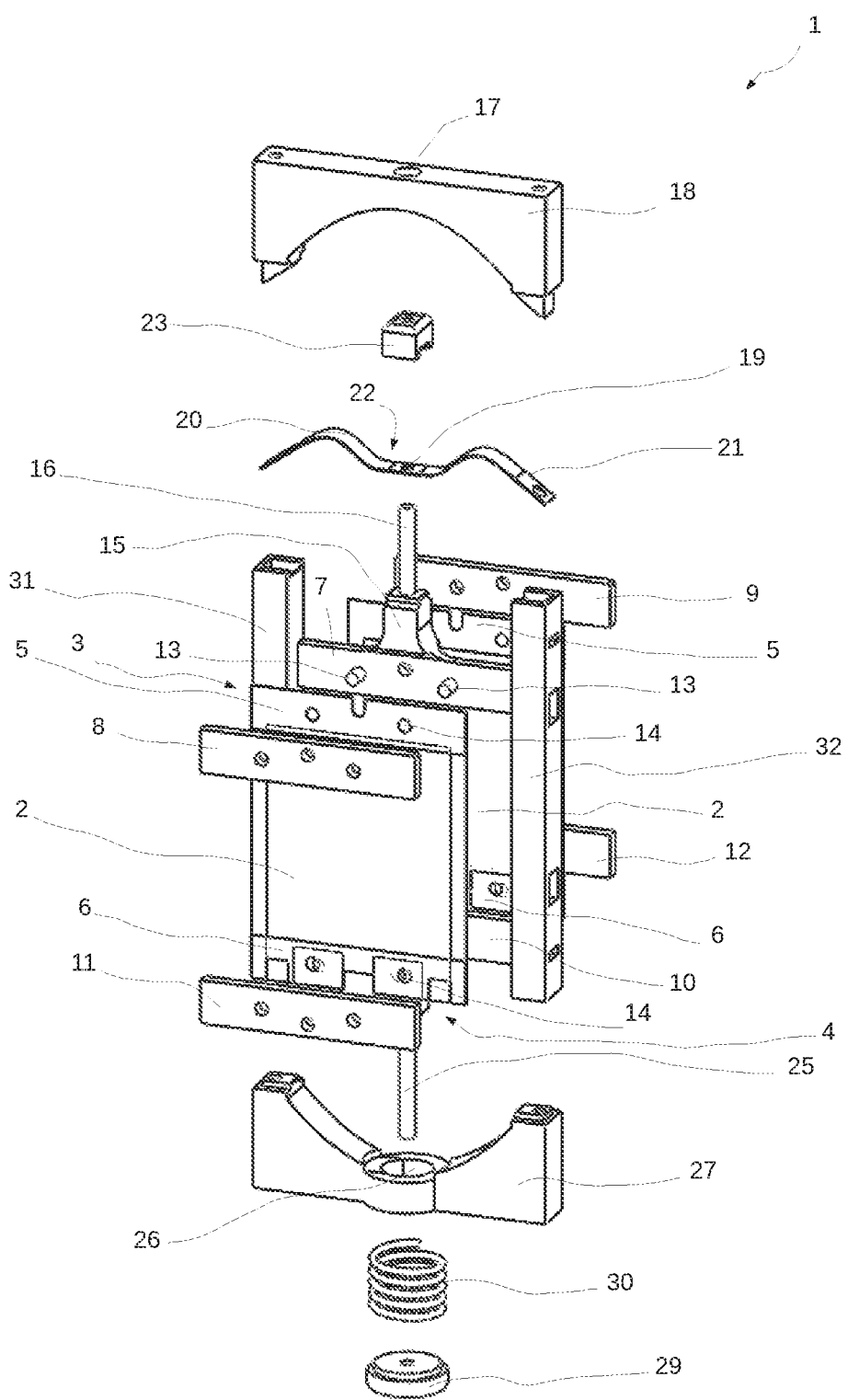
FIGS. 1A-1E A first embodiment of the invention in several views.

An actuator (1) shown in FIG. 1A in an exploded view comprises two foil-shaped actuator elements (2) formed from a dielectric elastomer material, which are each provided with a retaining section (5, 6) on two opposite sides (3, 4) and are arranged parallel to one another. The first retaining sections (5) are fitted between a first clamping block (7)

and outer first clamping rails (8, 9). The lower retaining sections (6) are fitted between a second clamping block (10) and outer further clamping rails (11, 12). Retaining pins (13) projecting from each clamping block (7, 10) in the direction of the clamping rails (8, 9, 11, 12) are provided for forming a plug-in connection with the clamping rails (8, 9, 11, 12) and are passed through openings (14) in the retaining sections (5, 6). A particularly good fixing can be advantageously achieved.

The fact that the two actuator elements (2) are arranged at the same horizontal distance from a longitudinal axis of cylindrical guiding pins (16, 25) means that, particularly advantageously, no transverse forces occur when the actuator (1) moves from an initial position to a working position or to an end position.

Although two actuator elements (2) are provided in this example, it is conceivable that a single or more than two actuator elements are provided. For example, three actuator elements may be provided, two of which are arranged at a horizontal distance from a longitudinal axis of the guiding pins (16, 25). A third actuator element can be arranged in such way that its deflection direction is coaxial to the longitudinal axis of the guiding pins (16, 25) during movement into the working position.

A base (15) is formed on a side of the first clamping block (7) facing away from the actuator elements (2), from which base the first guiding pin (16) projects, which engages in a guiding channel (17) of a first actuator frame end part (18). Furthermore, the pin (16) is passed through an opening (19) of a symmetrical snap spring (20) having end portions (21) bent in the installed state. For fixing a central part (22) of the snap spring (20), a fixing element (23) is provided, which is set up with a side facing the snap spring (20) for forming a snap-in connection with a side of the clamping block (7) facing the snap spring (20).

A base (24) is formed on a side of the second clamping block (10) facing away from the actuator elements (2), from which base the second guiding pin (25) projects, which is guided through a guiding channel (26) of a second actuator frame end part (27) out of an actuator frame (28) surrounding the actuator elements (2). Between an outer side of the actuator frame end part (27) and a disc-shaped end piece (29), a preloaded helical spring (30) surrounds the guiding pin (25), which has an end facing away from the second clamping block (10), which is provided for connection to the end piece (29).

The actuator frame (28) also has two actuator frame side parts (31, 32) connecting the first and second actuator frame end parts (18, 27). The end portions (21) of the snap spring (20) are connected to the actuator frame (28) between the actuator frame side parts (31, 32) and the actuator frame end part (18). In this embodiment, they are arranged obliquely to each of the actuator frame side parts (31, 32).

Electrical contacting of the foil elements and their control is carried out by means known to the skilled person and is not shown in FIG. 1.

Figure 1B:
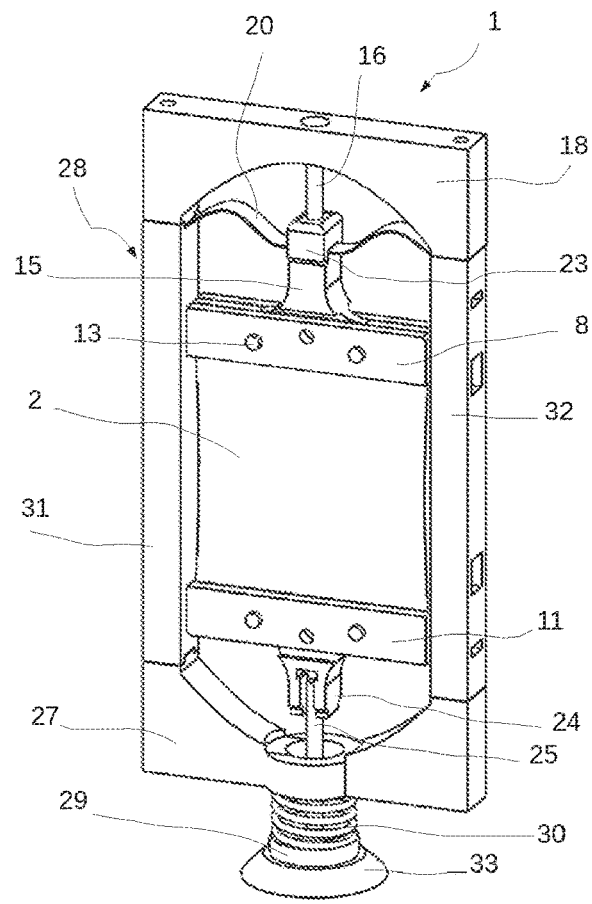
Figure 1C:
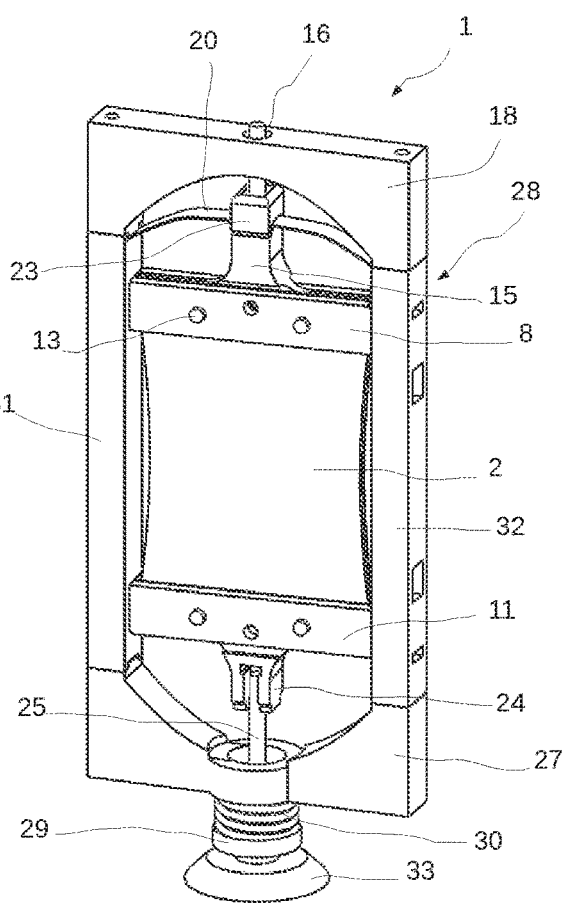

The actuator (1) is shown in FIG. 1B in an initial position in which no tension is applied to the actuator elements (2) and in FIG. 1C in an end position in which the end piece (29) is lifted off a base plate (33) shown in FIGS. 1B and C and the actuator elements (2) are deflected.

Furthermore, the snap spring (20) has changed from a first equilibrium position in the initial position of the actuator (19) to a second equilibrium position in the end position. Each actuator position between an initial position shown in FIG. 1B, for example, and an end position shown in FIG. 1C is a working position. Each working position can be controlled by a suitable choice of an electrical signal. When the actuator (1) is moved from the initial position to the end position or to a working position, the clamping rails (8, 11) shown in FIGS. 1B and C are moved from a position shown in FIG. 1B to a position shown in FIG. 1C, which is different from that shown in FIG. 1B, due to the floating bearing. A fixed abutment is not provided.

If the actuator (1) according to the invention is used, for example, to control a valve, the valve can be closed in the initial position of the actuator (1) and open in the working position. A maximum possible open position is shown in FIG. 1C in simplified form by lifting the end piece (29) off the base plate (33).

It is also conceivable that the actuator (1) is used to control a brake. A brake position corresponds to the initial position of the actuator and a maximum release position corresponds to the end position of the actuator. For this purpose, the end piece (29) can be designed, for example, as a brake lining that presses against a base plate (33) designed as a brake disk in the braking position.

Figure 1D:
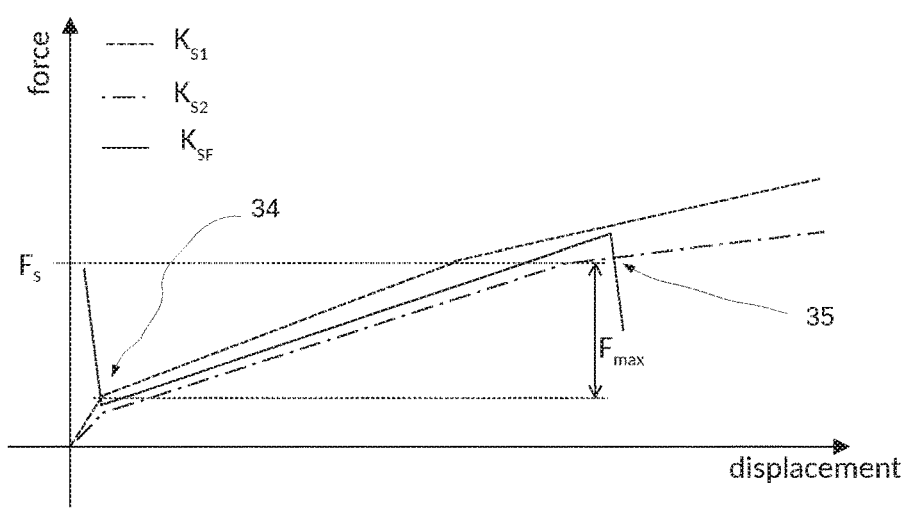
Figure 1E:
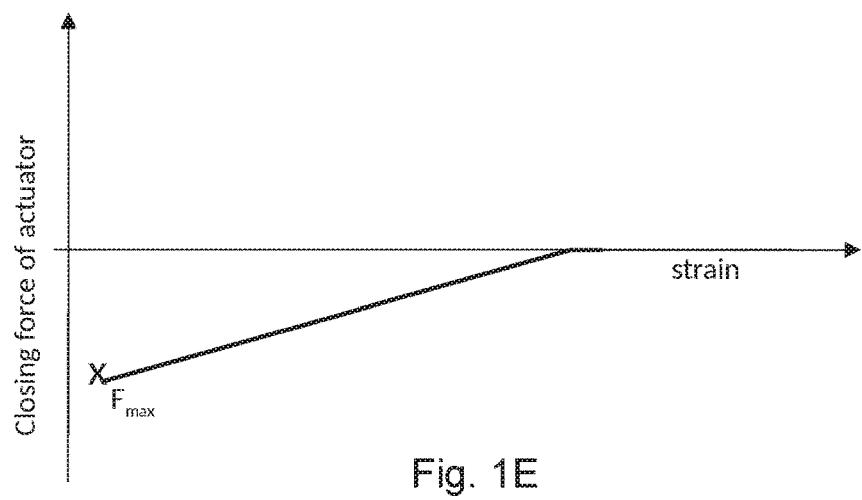

In a force-displacement diagram shown schematically in FIG. 1D, a constant force $F_S$ is shown which corresponds to the pretensioning force of the spring (30) and which must be overcome, for example, to open a valve or to open a brake.

Furthermore, the two characteristic curves of the snap spring (20) $K_{SF}$ are shown, as well as those characteristic curves $K_{S1}$ and $K_{S2}$ of a system consisting of the actuator elements (2) and the spring (30), where $K_{S1}$ is the characteristic curve at a voltage of 0 V applied to the actuator element and $K_{S2}$ is the characteristic curve at a voltage greater than 0 V, for example 2000 V, applied to the actuator element. Both the initial position of the actuator and the end position of the actuator are equilibrium positions of the system. The initial position is a first equilibrium position (34), which in FIG. 1D is an intersection of characteristic $K_{SF}$ with $K_{S1}$, while a second equilibrium position (35) is an intersection of characteristic $K_{SF}$ with $K_{S2}$. A snap spring is characterized by the characteristic $K_{SF}$.

The fact that the actuator elements (2) are mounted between the spring (30) and the snap spring (20) means that the actuator can provide a high force $F_{max}$, which can be used, for example, to open a valve or to press a brake lining against a brake disk. A curve of the actuator force as a function of the elongation of the actuator elements (2) is shown schematically in FIG. 1E.

Reference is now made to FIG. 2, where identical or like-acting parts with the same reference number as in FIG. 1 and the letter a is added to the respective reference number.

Figure 2A:
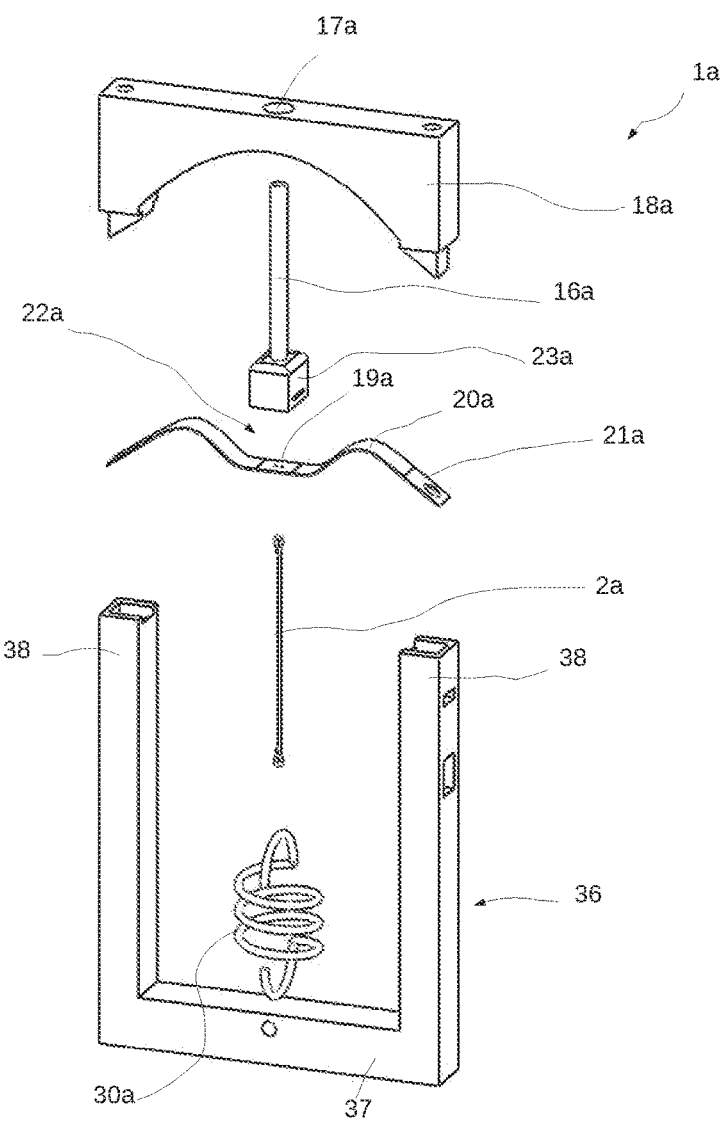
FIGS. 2A-2F a second embodiment of the invention in several views.

An actuator (1a) shown in FIG. 2A differs from that shown in FIG. 1A in that an actuator element (2a) is formed of a shape memory alloy (SMA), in particular a shape memory alloy comprising nickel and titanium, and is wire-shaped. Further, an actuator frame of the actuator element has a U-shaped actuator frame base (36), the base leg (37) of which is adapted to be connected to a spring (30a).

Figures 2B, 2C:
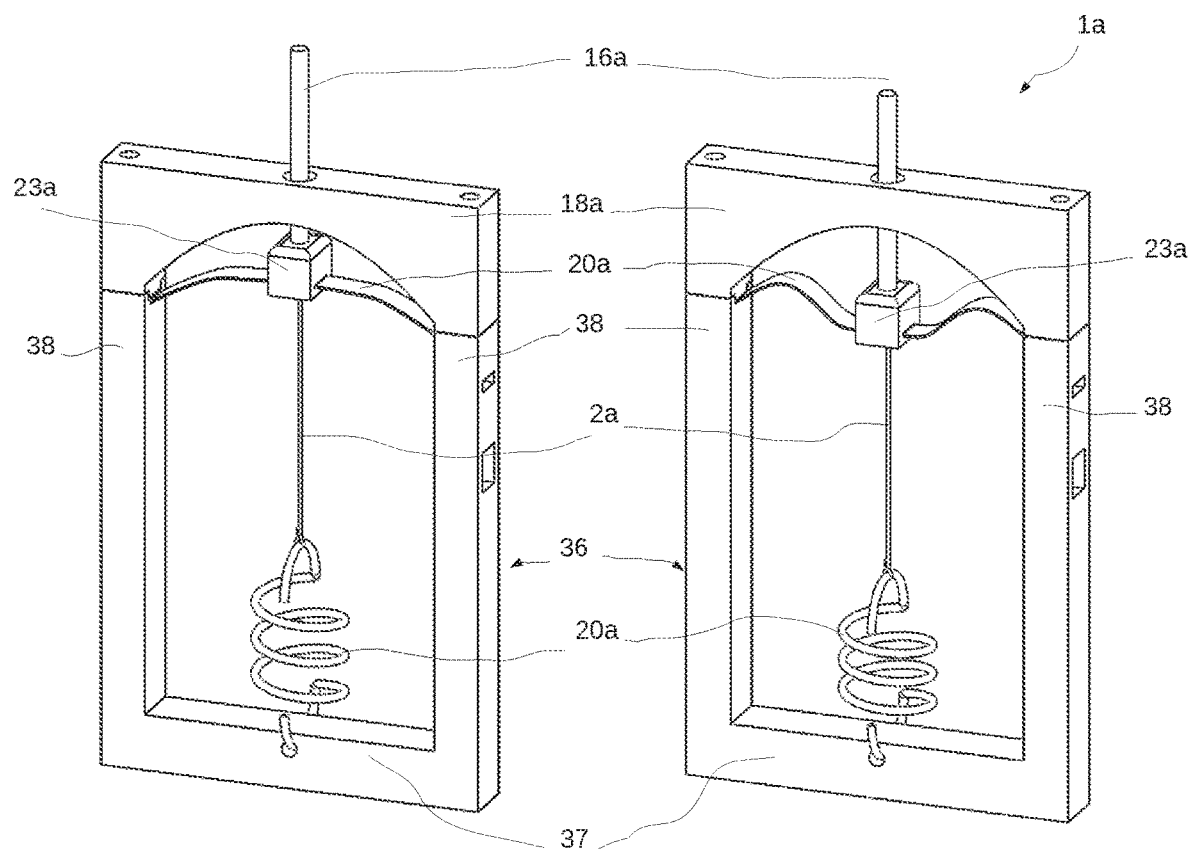

In an initial position of the actuator (1a) shown in FIG. 2B, the actuator element (2a) is in an elongated, deformed state. In an end position shown in FIG. 2C, the actuator element (2a) is in an original basic state in which it is shorter than in the initial position of the actuator (1a). A change from the elongated to the basic state can affected, for example, by heating, which is possible by applying a current I.

Figure 2D:
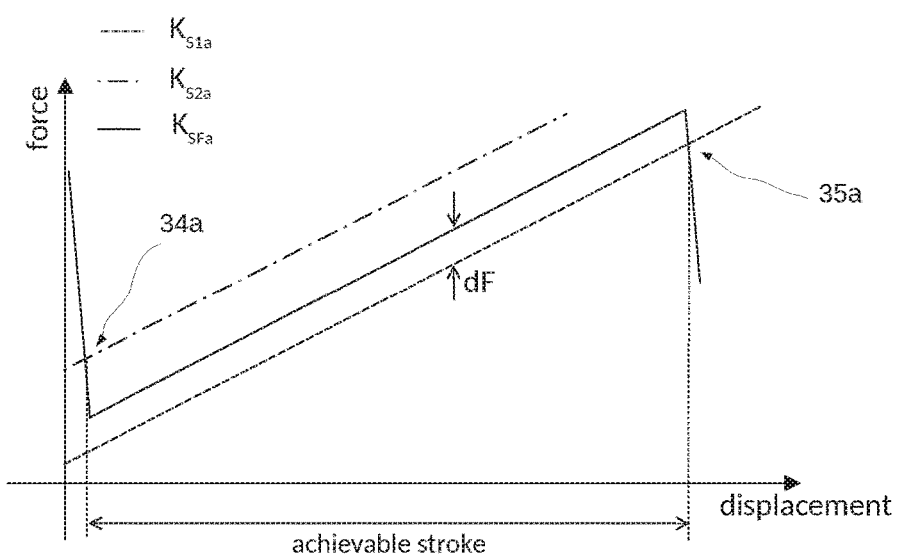
Figure 2E:
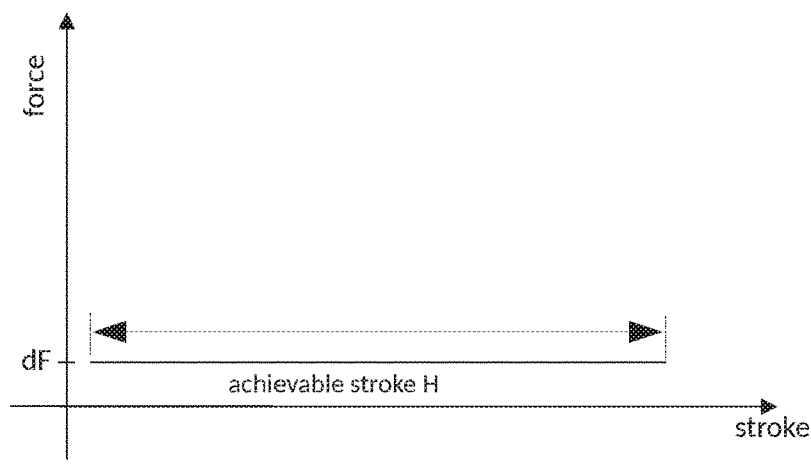

In a force-displacement diagram schematically shown in FIG. 2D, a maximum possible stroke H is shown. Furthermore, the two characteristic curves of the snap spring (20a) $K_{SFa}$ are shown, as well as those characteristic curves $K_{S1a}$ and $K_{S2a}$ of a system consisting of the actuator element (2a) and the spring (30a), where $K_{S2a}$ is the characteristic curve in an elongated state of the actuator element and $K_{S1a}$ is the characteristic curve when the actuator element is heated. Both an initial position of the actuator and an end position are equilibrium positions of the system. The initial position is a first equilibrium position (34a), which in FIG. 2D is an intersection of the characteristic curve $K_{SFa}$ with $K_{S2a}$, while a second equilibrium position (35a) is an intersection of the characteristic curve $K_{SFa}$ with $K_{S1a}$.

Because the actuator element (2a) is supported between the spring (30a) and the snap spring (20a), a small change in length of the actuator element (2a) can cause a high stroke H. This is shown schematically in FIG. 2E. A force dF shown in FIG. 2D denotes a maximum force that can be generated with the actuator according to the invention.

Figure 2F:
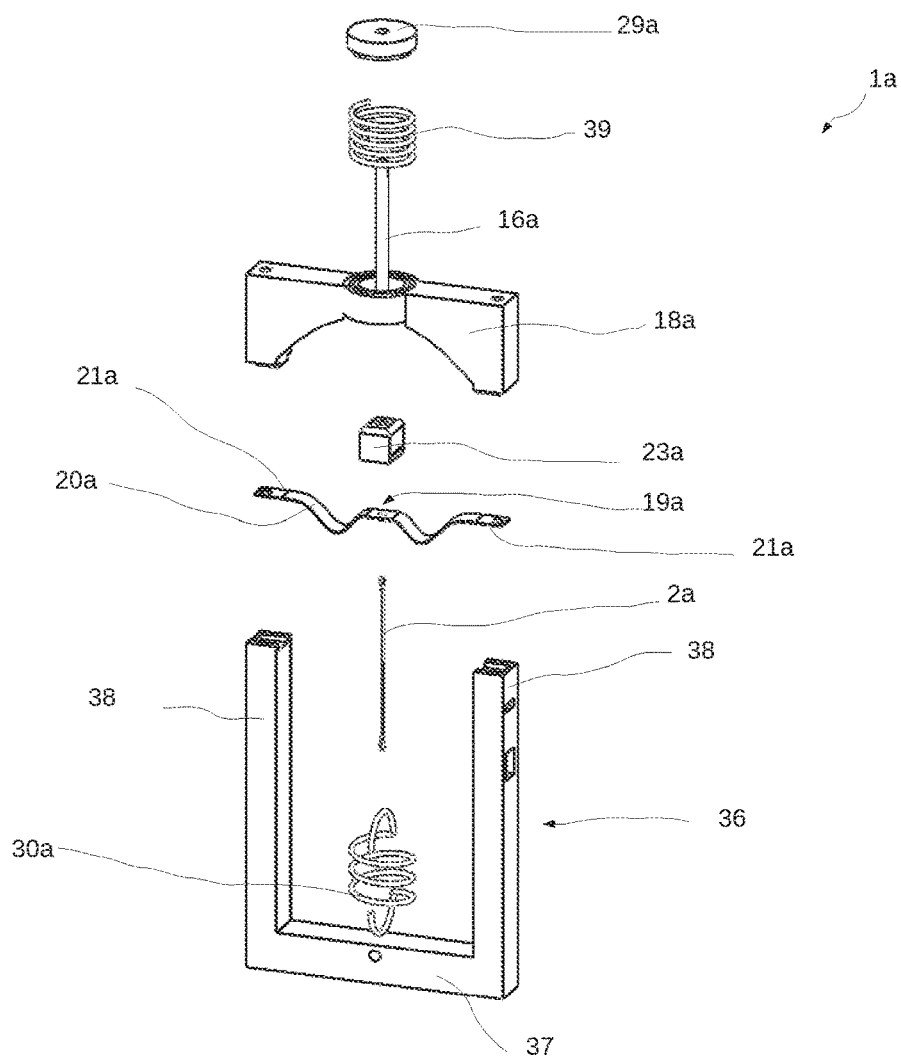

In a particular embodiment of an actuator (1a) shown in FIG. 2F, end sections (21a) of a snap spring (20a) are arranged perpendicular to legs (38) of an actuator frame base (36). Furthermore, the actuator (1a) comprises another preloaded coil spring (39) surrounding a guiding means (16a) and abutting against an end piece (29a). This arrangement of three restoring means (20, 30a, 39) allows an total restoring means characteristic curve of the actuator (1a) to be adjusted in such way that snapping back of the snap spring (20a) from the working position to the initial position and beyond the initial position is advantageously prevented.

In addition, the total restoring means characteristic curve is comparable to that of the actuator shown in FIGS. 2A to C.

Without the additional spring (39), an total restoring means characteristic curve would be altered such that the snap spring (20a) could snap toward a spring (30a) as well as away from a spring (30a).

While an actuator (1) shown in FIG. 1 is particularly suitable for generating a large force that can be used on a side facing a base plate (33), an actuator (1a) shown in FIG. 2 is suitable for generating a particularly large stroke.

Reference is now made to FIG. 3, where identical or like-acting parts with the same reference number as shown in FIGS. 1 and 2, and the letter b is added to the respective reference number.

A particular embodiment of an actuator (1b) shown in an exploded view in FIG. 3 differs from that shown in FIG. 1 in that a rotationally symmetrical, diaphragm-shaped, dielectric actuator element (2b) can be deflected out of a diaphragm plane.

A snap spring (20b) has four spring arms with barb-shaped ends (40), with which the snap spring (20b) can be connected to an actuator frame (28b) in a force-fitting, form-fitting and/or material-fitting manner. While in this embodiment the actuator frame (28b) can be moved from an initial position to a working position when the actuator (1b) is moved, a retaining element (41) that connects the snap spring (20b) to a helical spring (30b) and which is provided as an abutment for the two springs (20b, 30b) is arranged in a stationary manner and can be fastened, for example, to a retaining frame not shown in FIG. 3. For this purpose, a pin (45) projecting from a side of the retaining element (41) facing away from the coil spring (30b) and passing through an opening (19b) in the snap spring (20b) can be provided with an external thread into which a retaining tube of the retaining frame is screwed with an internal thread.

The actuator element (2b) is further formed as a dielectric elastomer sheet and is inserted into a two-part actuator element holding frame (42) attached to the actuator frame (28b) in such way that a deflection of the actuator element (2b) can be effected in a membrane-like manner, i.e. by a curvature parallel or preferably coaxial to a deflection direction of the coil spring (30b). An end piece (29b) is fixedly connected to the actuator element (2b) and causes flattening of its outer side. The coil spring (30b) is arranged between the stationary retaining element (41) and the end piece (29b). The movable actuator frame (28b) and the actuator element (2b) form part of a movable actuator housing.

Figure 3A:
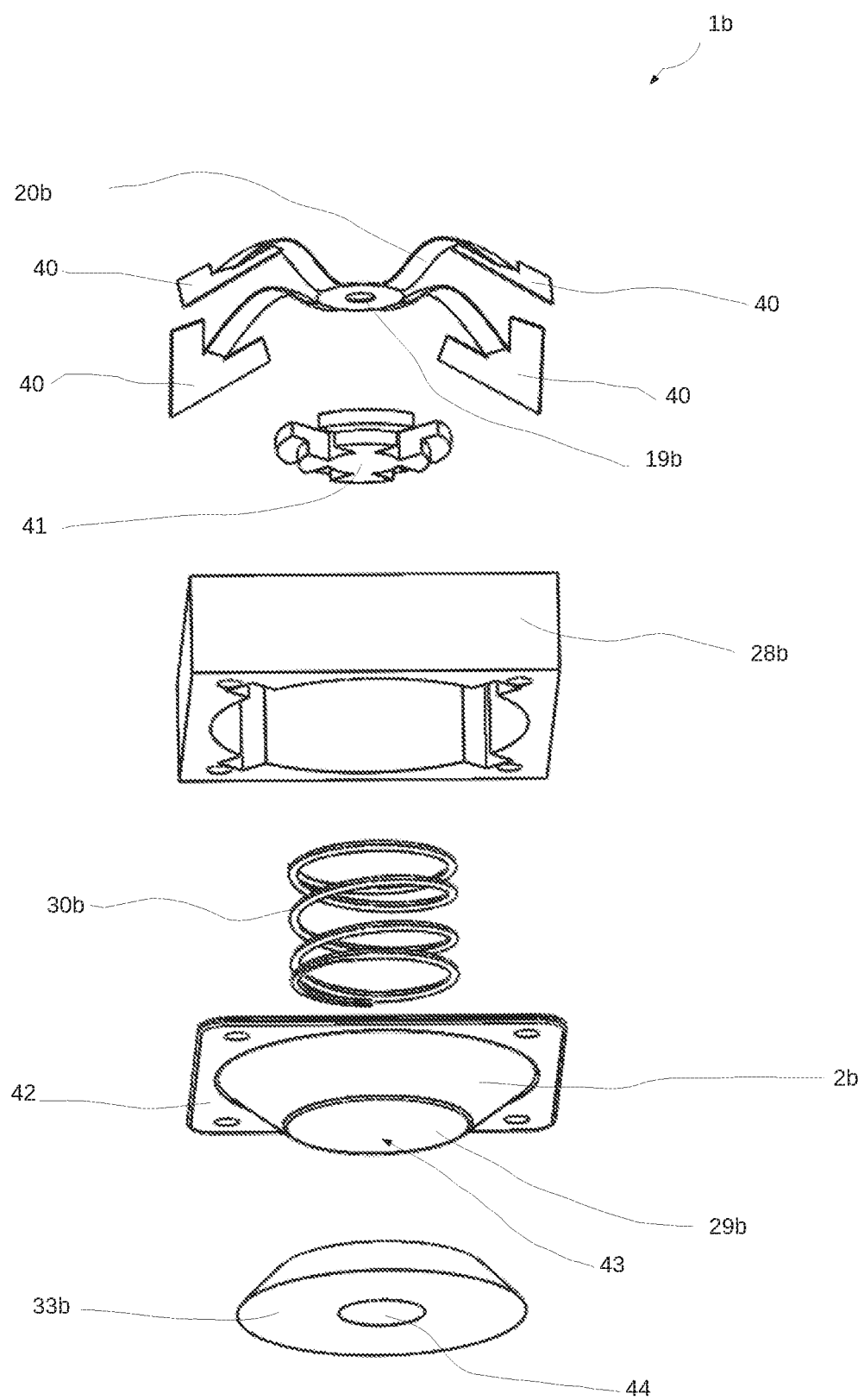
FIGS. 3A-3C a particularly compact embodiment of the invention in several views.
Figure 3B:
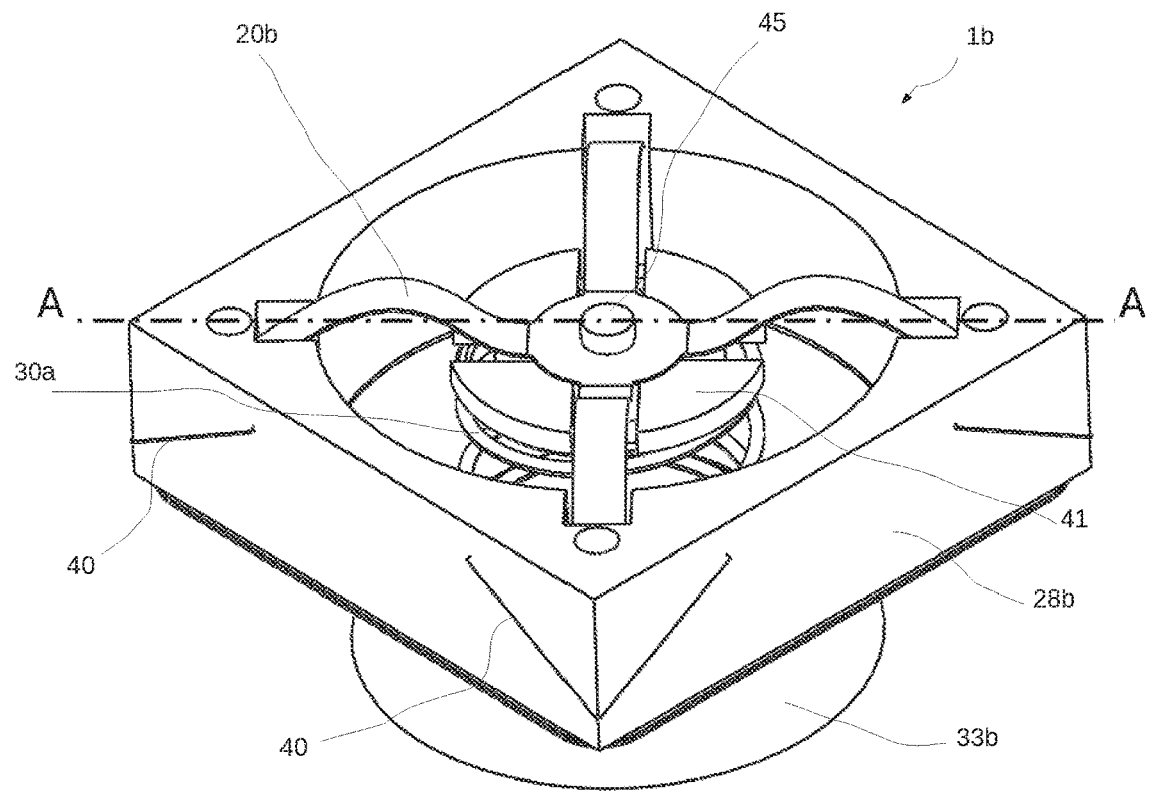

FIG. 3B shows a perspective view of the actuator shown in FIG. 3A.

Figure 3C:
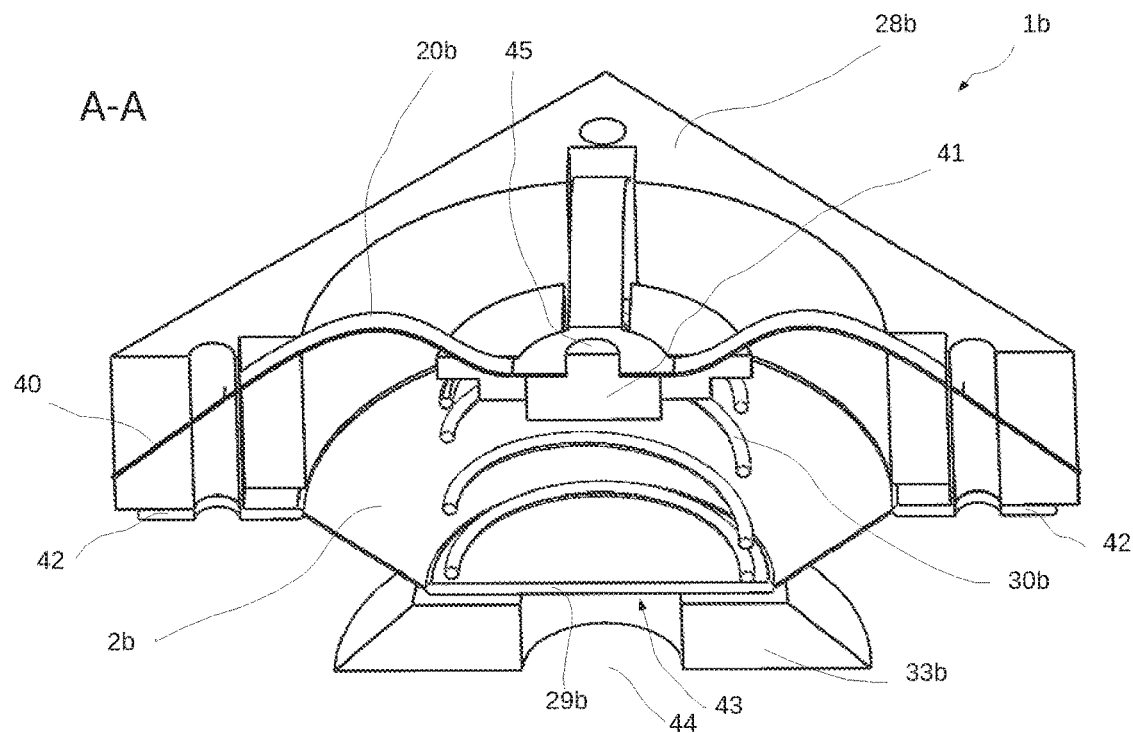

In an initial position of the actuator (1b), which is shown in FIG. 3C in section A-A, a side (43) of the end piece (29b) facing a base plate (33b) rests against the base plate (33b) and covers an opening (44). When the actuator (1b) is moved to an end position, i.e. to a maximum possible working position, the end piece (29b) and the movable actuator frame (28b) are moved vertically away from the base plate (33b). The four spring arms of the snap spring (20b) connected to the movable actuator frame (28b), whose longitudinal axes are arranged at right angles to each other, enable a guided linear movement.

A force-displacement characteristic curve of the actuator (1b) shown in FIG. 3 is qualitatively identical to that shown in FIG. 1D.

The embodiment shown in FIG. 3 advantageously makes a compact design of the actuator possible.

Although two restoring means (20, 30; 20a, 30a; 20b, 30b) are provided in the embodiments shown in FIGS. 1, 2A to 2E and FIG. 3, it is conceivable that an actuator element (2, 2a; 2b) is arranged between a plurality of restoring means acting on the actuator element, which restoring means may further be of different designs and may have restoring means characteristics different from each other.

The invention claimed is:

1. Actuator which can be moved from an initial position into a working position having at least one actuator element whose dimensions can be changed by an electrical signal, wherein at least two restoring means acting on the actuator element are provided for movement into the working position, the at least one actuator element being floatingly mounted between the at least two restoring means acting on said actuator element, characterized in that one of the at least two restoring means is a spring with a non-linear characteristic that is movable by a force from a first equilibrium position to a second equilibrium position different from the first one or in that a first restoring means comprises a body formed of a magnetic material which is arranged at a variable distance from a plate formed of a metal or a further body formed of a magnetic material, wherein the magnetic body and the plate or the further magnetic body have opposite or equal polarity on surfaces facing each other.

2. Actuator according to claim 1, characterized in that a first restoring means comprises at least one snap spring, and/or a second restoring means comprises at least one helical spring.

3. Actuator according to claim 1, characterized in that one of the restoring means comprises at least one non-linear spring, designed as a snap spring, end sections of which are arranged obliquely, horizontally or perpendicularly to an actuator frame side part of an actuator frame.

4. Actuator according to claim 1, characterized in that the at least one actuator element is planar, cylindrical or frustoconical.

5. Actuator according to claim 1, characterized in that a length of the at least one actuator element can be changed by an electrical signal, a change in length taking place in an actuator element plane or along an axis of symmetry in a longitudinal direction.

6. Actuator according to claim 1, characterized in that the at least one actuator element is deflectable in a direction that is parallel or coaxial to an effective direction of a restoring force of at least one of the restoring means acting on the actuator element.

7. Actuator according to claim 1, characterized in that at least one of the two restoring means is arranged within the actuator frame or the actuator housing.

8. Actuator according to claim 1, characterized in that a first end portion of the at least one actuator element and a second end portion, opposite the first portion, are provided with retaining elements.

9. Actuator according to claim 1, characterized in that an actuating means is provided which is also set up for guiding a movement out of the initial position into the working position.

10. Actuator according to claim 1, characterized in that several planar actuator elements arranged parallel to one another are provided.

11. Actuator according to claim 1, characterized in that at least one cylindrical actuator element is provided, which is formed from a rolled-up actuator foil.

12. Actuator according to claim 1, characterized in that at least one of the two restoring means is preloaded and forms a component of an assembly to be actuated, or that an actuating means forms a component of an assembly to be actuated.

13. Actuator according to claim 1, characterized in that the actuator element comprises a dielectric foil or is formed of a shape memory alloy.

\* \* \* \* \*